(12) United States Patent
Sakaguchi

(10) Patent No.: US 9,052,437 B2
(45) Date of Patent: Jun. 9, 2015

(54) PHOTOSENSITIVE RESIN COMPOSITION FOR FORMING MICROLENS

(75) Inventor: Takahiro Sakaguchi, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 189 days.

(21) Appl. No.: 13/982,316

(22) PCT Filed: Jan. 12, 2012

(86) PCT No.: PCT/JP2012/050479
§ 371 (c)(1),
(2), (4) Date: Jul. 29, 2013

(87) PCT Pub. No.: WO2012/105288
PCT Pub. Date: Aug. 9, 2012

(65) Prior Publication Data
US 2013/0310480 A1    Nov. 21, 2013

(30) Foreign Application Priority Data

Jan. 31, 2011 (JP) .................................. 2011-018458

(51) Int. Cl.
| | |
|---|---|
| C08F 216/14 | (2006.01) |
| G03F 7/038 | (2006.01) |
| C08F 222/40 | (2006.01) |
| G02B 1/04 | (2006.01) |
| C08F 12/24 | (2006.01) |
| C08F 212/12 | (2006.01) |

(Continued)

(52) U.S. Cl.
CPC ............... *G02B 1/041* (2013.01); *C08F 12/24* (2013.01); *C08F 212/12* (2013.01); *C08F 212/14* (2013.01); *C08F 212/32* (2013.01); *C08F 216/1416* (2013.01); *C08F 222/40* (2013.01); *G03F 7/0382* (2013.01)

(58) Field of Classification Search
CPC .. G03F 7/0382; C08F 216/1416; C08F 12/24; C08F 212/14; C08F 212/12; C08F 212/32; C08F 222/40
See application file for complete search history.

(56) References Cited

U.S. PATENT DOCUMENTS 3,857,822 A * 12/1974 Frass .............................. 525/262
4,490,461 A * 12/1984 Webb et al. .................... 430/510
(Continued)

FOREIGN PATENT DOCUMENTS

| | | |
|---|---|---|
| EP | 0 140 273 A2 | 5/1985 |
| JP | B2-6-23842 | 3/1994 |

(Continued)

OTHER PUBLICATIONS

Aug. 6, 2013 International Preliminary Report on Patentability issued in International Patent Application No. PCT/JP2012/050479.

(Continued)

*Primary Examiner* — Sanza McClendon
(74) *Attorney, Agent, or Firm* — Oliff PLC

(57) ABSTRACT

There is provided a photosensitive resin composition for forming a microlens. A photosensitive resin composition for forming a microlens, the photosensitive resin composition comprising: a component (A), a component (B), a component (C) and a solvent. The component (A) is a copolymer having a maleimide structural unit of formula (1) below, a vinyl ether structural unit of formula (2) below, and at least one of the three structural units of formula (3), formula (4), and formula (5) below, the component (B) is a photosensitizer, and the component (C) is a cross-linking agent

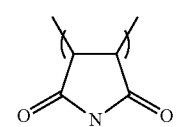 (1)

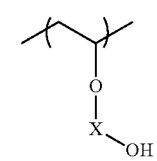

(2)

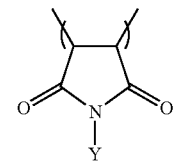

(3)

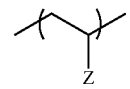

(4)

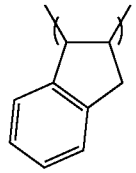

(5)

(where X is a $C_{1-20}$ hydrocarbon group that optionally has an ether bond or a cyclic structure; Y is an organic group that optionally has a substituent; and Z is an aromatic hydrocarbon group or an alkoxy group that optionally has a substituent).

5 Claims, No Drawings

(51) Int. Cl.
*C08F 212/14* (2006.01)
*C08F 212/32* (2006.01)

(56) References Cited

U.S. PATENT DOCUMENTS

| | | | | |
|---|---|---|---|---|
| 4,663,268 | A * | 5/1987 | Turner et al. | 430/270.1 |
| 4,720,445 | A * | 1/1988 | Brahim et al. | 430/192 |
| 5,644,016 | A * | 7/1997 | Roschert et al. | 528/170 |
| 6,551,760 | B2 * | 4/2003 | Uesugi et al. | 430/278.1 |
| 6,586,560 | B1 * | 7/2003 | Chen et al. | 430/272.1 |
| 7,226,717 | B2 * | 6/2007 | Nakamura et al. | 430/270.1 |
| 7,371,504 | B2 * | 5/2008 | Nakamura | 430/270.1 |
| 7,611,824 | B2 * | 11/2009 | Goto | 430/302 |
| 8,110,324 | B2 * | 2/2012 | Fujimori et al. | 430/7 |
| 8,119,311 | B2 * | 2/2012 | Fujimori et al. | 430/7 |
| 2005/0153221 | A1 * | 7/2005 | Goto | 430/18 |
| 2007/0148593 | A1 * | 6/2007 | Shimada et al. | 430/270.1 |
| 2009/0124776 | A1 * | 5/2009 | Takai | 526/268 |
| 2010/0096663 | A1 | 4/2010 | Negi et al. | |
| 2011/0086310 | A1 | 4/2011 | Yukawa et al. | |
| 2011/0159433 | A1 * | 6/2011 | Takahashi et al. | 430/286.1 |
| 2012/0156598 | A1 * | 6/2012 | Kishioka et al. | 430/8 |

FOREIGN PATENT DOCUMENTS

| | | |
|---|---|---|
| JP | A-2001-354822 | 12/2001 |
| JP | A-2002-323771 | 11/2002 |
| JP | A-2003-131375 | 5/2003 |
| JP | A-2004-224894 | 8/2004 |
| JP | WO 2008/143095 A1 | 11/2008 |
| JP | A-2008-303315 | 12/2008 |
| JP | A-2009-157038 | 7/2009 |
| JP | A-2009-179770 | 8/2009 |
| WO | WO 8905996 A1 * | 6/1989 |
| WO | WO 9321556 A1 * | 10/1993 |
| WO | WO 2009/084382 A1 | 7/2009 |
| WO | WO 2010/007915 A1 | 1/2010 |
| WO | WO 2011/024545 A1 | 3/2011 |

OTHER PUBLICATIONS

Apr. 3, 2012 International Search Report issued in International Patent Application No. PCT/JP2012/050479.

* cited by examiner

PHOTOSENSITIVE RESIN COMPOSITION FOR FORMING MICROLENS

TECHNICAL FIELD

The present invention relates to a photosensitive resin composition for forming a microlens and a microlens formed of the photosensitive resin composition.

BACKGROUND ART

In general, a microlens installed in an image sensor is manufactured using a photosensitive resin composition.

In such a microlens, in general, required properties include the reduction of coloring by high-temperature heating and the prevention of a reduction in transparency (resistance to heat discoloration) and being formed in a favorable patterned shape (patterning capability) as well as transparency, heat-resistance, and solvent-resistance. As the photosensitive resin composition used herein, a photosensitive resin composition for forming a microlens that contains a hydroxystyrene-based copolymer or polyhydroxystyrene has been conventionally known.

A photoresist composition, a composition for forming an anti-reflective coating, and a material for forming a resist protection coating for immersion lithography that each contain a maleimide-based copolymer have been developed (Patent Documents 1 to 4). For the purpose of the development of insulating films for display devices such as liquid crystal displays (LCDs) and organic electroluminescent displays, a method for forming an insulating film for a display device that employs a radiation-sensitive resin composition containing: an alkali-soluble copolymer containing indene, maleimide, and N-substituted maleimide, a 1,2-naphtoquinone diazide compound, and a cross-linking agent has been developed (Patent Document 5).

Furthermore, being extremely excellent in compatibility with polyfunctional (meth)acrylate and having favorable alkali solubility, and for the purpose of being used in various uses in which such characteristics are required, a maleimide-based copolymer that is characterized by containing a monomer structural unit of unsubstituted maleimide origin, a monomer structural unit of styrenes origin, and a monomer structural unit of (meth)acrylic acid origin has been developed (Patent Document 6).

However, these prior documents do not have an object of providing a use as a photosensitive resin composition for forming a microlens and do not suggest any specific means or effect for the application of a copolymer having an unsubstituted maleimide structural unit and a vinyl ether structural unit to a photosensitive resin composition for forming a microlens.

A radiation-sensitive resin composition that contains [A] a polymer of (a1) unsaturated carboxylic acid and/or an unsaturated carboxylic acid anhydride, (a2) an epoxy group-containing unsaturated compound, (a3) a maleimide-based monomer, and (a4) other olefin-based unsaturated compounds and [B] a 1,2-quinonediazide compound has been disclosed (Patent Document 7). However, although it is described that the radiation-sensitive resin composition reported in this document can obtain high radiation-sensitivity and easily form a patterned thin film having excellent solvent-resistance, heat-resistance, transparency, and resistance to heat discoloration, the document does not suggest any specific shape accuracy of a pattern formed of the composition. Furthermore, it does not describe unsubstituted maleimide as the maleimide-based monomer.

PRIOR ART DOCUMENTS

Patent Documents

Patent Document 1: U.S. Pat. No. 6,586,560 (U.S. Pat. No. 6,586,560 B1) specification
Patent Document 2: Japanese Examined Patent Application Publication No. H06-23842 (JP H06-23842 B)
Patent Document 3: Japanese Patent Application Publication No. 2008-303315 (JP 2008-303315 A)
Patent Document 4: Japanese Patent Application Publication No. 2002-323771 (JP 2002-323771 A)
Patent Document 5: Japanese Patent Application Publication No. 2003-131375 (JP 2003-131375 A)
Patent Document 6: Japanese Patent Application Publication No. 2004-224894 (JP 2004-224894 A)
Patent Document 7: Japanese Patent Application Publication No. 2001-354822 (JP 2001-354822 A)

SUMMARY OF THE INVENTION

Problem to be Solved by the Invention

Because a conventional microlens manufactured using a photosensitive resin composition for forming a microlens containing a hydroxystyrene-based copolymer or polyhydroxystyrene is likely to be colored by high-temperature heating, it has a tendency to degrade its transparency, leaving room for improvement.

The present invention has been achieved in view of the above circumstances, and an object thereof is to provide a photosensitive resin compound for forming a microlens that can remarkably improve transparency, heat-resistance, resistance to heat discoloration, and solvent-resistance of a cured film and patterning capability of a photosensitive resin

Means for Solving the Problem

The inventors of the present invention have earnestly studied to solve the above problem and achieved the present invention.

Disclosed is a photosensitive resin composition for forming a microlens, the photosensitive resin composition comprising:
a component (A);
a component (B);
a component (C); and
a solvent, in which
the component (A) is a copolymer having a maleimide structural unit of formula (1) below, a vinyl ether structural unit of formula (2) below, and at least one of the three structural units of formula (3), formula (4), and formula (5) below,
the component (B) is a photosensitizer, and
the component (C) is a cross-linking agent

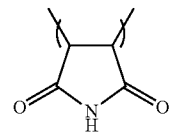

(1)

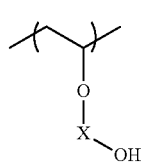
(2)

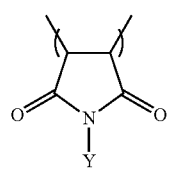
(3)

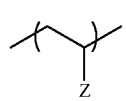
(4)

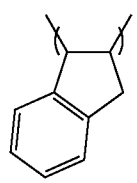
(5)

(where X is a $C_{1-20}$ hydrocarbon group; Y is a $C_{1-5}$ alkyl group, a $C_{5-6}$ cycloalkyl group, a phenyl group, or a benzyl group; and Z is a phenyl group, a naphthyl group, an anthracenyl group, a biphenylyl group, or a $C_{1-8}$ alkoxy group, provided that the group represented by X optionally has an ether bond or a cyclic structure; part of or all of hydrogen atoms of the group represented by Y are optionally substituted with a halogen atom, a carboxy group, a hydroxy group, an amino group, or a nitro group; and part of or all of hydrogen atoms of a phenyl group, a naphthyl group, an anthracenyl group, or a biphenylyl group represented by Z are optionally substituted with a $C_{1-10}$ alkyl group, a $C_{5-6}$ cycloalkyl group, a halogen atom, a carboxy group, a hydroxy group, an amino group, or a nitro group).

Another aspect of the present invention is a cured film obtained from the photosensitive resin composition for forming a microlens.

Still another aspect of the present invention is a microlens manufactured from the photosensitive resin composition for forming a microlens.

Effects of the Invention

A film formed of the photosensitive resin composition for forming a microlens according to the present invention can have excellent transparency, heat-resistance, resistance to heat discoloration, and solvent-resistance.

A pattern formed of the photosensitive resin composition for forming a microlens according to the present invention can also have excellent heat-resistance.

From the foregoing the film formed of the photosensitive resin composition for forming a microlens according to the present invention can remarkably reduce the possibility that a microlens is colored and that the lens shape is deformed when the microlens is subjected to a high-temperature heating treatment in its formation process or a formation process for peripheral devices such as wiring. When electrodes and wiring formation processes are performed after the formation of the microlens, disadvantages such as deformation and separation of the microlens caused by an organic solvent can be remarkably reduced.

The photosensitive resin composition for forming a microlens according to the present invention is therefore suitable for a material for forming a microlens.

MODES FOR CARRYING OUT THE INVENTION

The present invention is a photosensitive resin composition for forming a microlens comprising a copolymer having a maleimide structural unit and a vinyl ether structural unit having a hydroxy group as a component (A), a photosensitizer as a component (B), a cross-linking agent as a component (C), and a solvent.

The details of the components will be described below.

A solid content after removing the solvent from the photosensitive resin composition for forming a microlens according to the present invention is generally 1% by mass to 50% by mass.

<Copolymer>

The copolymer as the component (A) in the composition according to the present invention is a copolymer having a maleimide structural unit of the above formula (1), a vinyl ether structural unit of the above formula (2), and at least one of the three structural units of the above formula (3), formula (4), and formula (5).

In the vinyl ether structural unit of formula (2), examples of cases when X is a $C_{1-20}$ hydrocarbon group having an ether bond or a cyclic structure include formula (2-1) and formula (2-2):

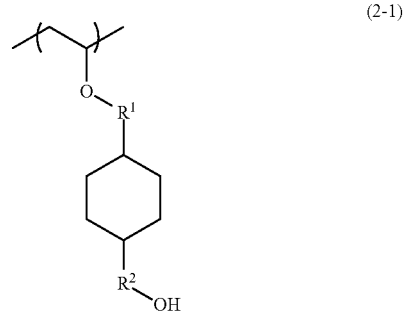
(2-1)

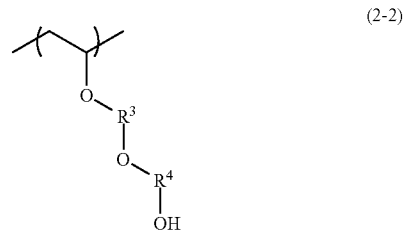
(2-2)

(where $R^1$ and $R^2$ are each independently a linear or branched $C_{1-7}$ alkylene group or a single bond; and $R^3$ and $R^4$ are each independently a linear or branched $C_{1-10}$ alkylene group).

In the above formula (2-1), when $R^1$ and $R^2$ are each single bond, the cyclohexylene group in the formula is directly bonded to the oxygen atom and the hydroxy group, In formula (2), examples of the $C_{1-20}$ hydrocarbon group that may optionally have an ether bond or a cyclic structure represented by X include a methylene group, an ethylene group, a trimethylene group, a tetramethylene group, a pentamethylene group, a hexamethylene group, a cyclohexane-1,4-diyl group, a cyclohexane-1,4-dimethylene group, a dimethylene ether group, a diethylene ether group, an ethylene methylene ether group, a dipropylene ether group, an ethylene propylene ether group, a methylene propylene ether group, and diisopropylene ether group.

The vinyl ether structural unit of formula (2) has a hydroxy group to be a cross-linking site on its side chain. Owing to that, the composition according to the present invention containing the copolymer having the structural unit has favorable cross-linking efficiency and improved curability, and provides a lens pattern, which is formed by development, with excellent form maintainability. Specific examples of a vinyl ether compound forming the vinyl ether structural unit include 2-hydroxyethyl vinyl ether, 3-hydroxypropyl vinyl ether, 4-hydroxybutyl vinyl ether, 5-hydroxypentyl vinyl ether, 6- hydroxyhexyl vinyl ether, 4-hydroxycyclohexyl vinyl ether, 1,4-cyclohexane dimethanol monovinyl ether, diethylene glycol monovinyl ether, and dipropylene glycol monovinyl ether. These vinyl ether compounds may be used alone, or two or more thereof may be used in combination.

Specific examples of a compound forming the structural unit of formula (3) and specific examples of a compound forming the structural unit of formula (4) are shown in formulae (3-1) to (3-7) and (4-1) to (4-5) below, respectively.

(3-1)

(3-2)

(3-3)

(3-4)

(3-5)

(3-6)
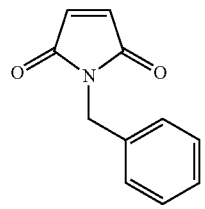

(3-7)
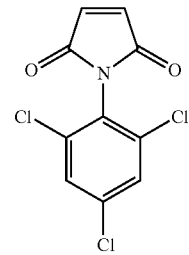

(4-1)
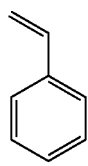

(4-2)
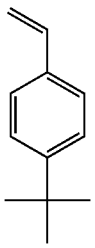

(4-3)
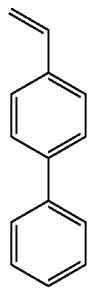

(4-4)
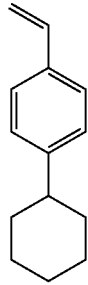

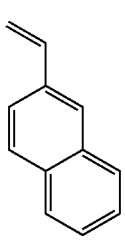

(4-5)

In the copolymer as the component (A), the content of the structural unit of formula (1) with respect to the sum of the structural unit of formula (1), the structural unit of formula (2), and at least one of the three structural units of formula (3), formula (4), and formula (5) is 20% by mole to 80% by mole, and preferably 25% by mole to 70% by mole. The content of the structural unit of formula (2) is 5% by mole to 65% by mole, and preferably 10% by mole to 55% by mole. The content of at least one of the three structural units of formula (3), formula (4), and formula (5) is 15% by mole to 75% by mole, and preferably 20% by mole to 65% by mole.

The weight average molecular weight of the copolymer is, for example, 1000 to 50000, and preferably 3000 to 30000. The weight average molecular weight is a value obtained by gel permeation chromatography (GPC) using polystyrene as a standard sample.

The content of the component (A) in the composition according to the present invention is generally 1% by mass to 99% by mass, and preferably 10% by mass to 95% by mass, based on its content in the solid contents of the composition.

In the present invention, a method for obtaining the component (A) is not particularly limited. In general, it is obtained by subjecting a monomer mixture containing monomer species used for obtaining the above copolymer to a polymerization reaction in a polymerization solvent generally at a temperature of 50° C. to 110° C.

<Component (B)>

Although the photosensitizer as the component (B) in the composition according to the present invention is not particularly limited so long as it is a compound that can be used as a photosensitizing component, it is preferably a 1,2-naphtoquinone diazide compound. As the 1,2-naphtoquinone diazide compound, a hydroxy group-containing compound in which 10% by mole to 100% by mole, preferably 20% by mole to 95% by mole of the hydroxy groups are 1,2-naphtoquinone diazide sulfonic acid esterified can be used.

Examples of the hydroxy group-containing compound include: phenol compounds such as phenol, o-cresol, m-cresol, p-cresol, hydroquinone, resorcinol, catechol, methyl gallicate, ethyl gallicate, 1,3,3-tris(4-hydroxyphenyl) butane, 4,4'-isopropylidene diphenol, 1,1-bis(4-hydroxyphenyl) cyclohexane, 4,4'-dihydroxydiphenylsulfone, 4,4'-(hexafluoroisopropylidene) diphenol, 4,4',4''-trishydroxyphenylethane, 1,1,1-trishydroxyphenylethane, 4,4'-[1-[4-[1-(4-hydroxyphenyl)-1-methylethyl]phenyl]ethylidene]bisphenol, 2,4-dihydroxybenzophenone, 2,3,4-trihydroxybenzophenone, 2,2',4,4'-tetrahydroxybenzophenone, 2,3,4,4'-tetrahydroxybenzophenone, 2,2',3,4,4'-pentahydroxybeozophenone, and aliphatic alcohols such as ethanol, 2-propanol, 4-butanol, cyclohexanol, ethylene glycol, propylene glycol, diethylene glycol, dipropylene glycol, 2-methoxy ethanol, 2-butoxy ethanol, 2-methoxy propanol, 2-butoxy propanol, ethyl lactate, and butyl lactate.

These photosensitizers can be used alone, or two or more thereof may be used in combination.

The content of the component (B) in the composition according to the present invention is generally 1% by mass to 50% by mass, based on its content in the solid contents of the composition.

The cross-linking agent as the component (C) in the composition according to the present invention is a compound that forms bonds with formulations such as a resin and a photosensitizer and other cross-linking agent molecules through the action of heat or acid. Examples of the cross-linking agent include a hydroxymethyl group-substituted phenol compound, an alkoxyalkylated amino group-containing compound, and an epoxy compound. These cross-linking agents can be used alone, or two or more thereof may be used in combination.

Examples of the hydroxymethyl group-substituted phenol compound include a 2-hydroxymethyl-4,6-dimethylphenol, 1,3,5-trihydroxymethylbenzene, and 3,5-dihydroxymethyl-4-methoxytoluene[2,6-bis(hydroxymethyl)-p-cresol].

Examples of the alkoxyalkylated amino group-containing compound include nitrogen-containing compounds that include a plurality of active methylol groups in one molecule such as (poly)methylol melamine, (poly)methylol glycoluril, (poly)methylol benzoguanamine, and (poly)methylol urea, in which at least one of the hydrogen atoms of the hydroxy groups of the methylol groups is substituted with an alkyl group such as a methyl group and butyl group.

The alkoxyalkylated amino group-containing compound may be a mixture of a plurality of substituted compounds and may include a mixture containing a partially self-condensed oligomer component. Such a mixture may also be used. More specific examples include: CYMEL-series products such as hexamethoxymethyl melamine (CYMEL (registered trademark) 303 manufactured by Nihon Cytec Industries Inc.), tetrabutoxymethyl glycoluril (CYMEL (registered trademark) 1170 manufactured by Nihon Cytec Industries Inc.), and tetramethoxymethyl benzoguanamine (CYMEL (registered trademark) 1123 manufactured by Nihon Cytec Industries Inc.) and NIKALAC-series products such as methylated melamine resin (NIKALAC (registered trademark) MW-30HM, MW-390, MW-100LM, and MX-750LM manufactured by Sanwa Chemical Co., Ltd.) and methylated urea resin (NIKALAC (registered trademark) MX-270, MX-280, and. MX-290 manufactured by Sanwa Chemical Co., Ltd.).

Although examples of the epoxy resin include the following commercially available products, it is not limited to these examples. Examples of a bisphenol A type epoxy resin include jER (registered trademark) 828, 834, 1001, and 1004 (manufactured by Mitsubishi Chemical Corporation) and EPICLON (registered trademark) 850, 860, and 4055 (manufactured by DIC Corporation). Examples of a bisphenol F type epoxy resin include jER (registered trademark) 807 (manufactured by Mitsubishi Chemical Corporation) and EPICLON (registered trademark) 830 (manufactured by DIC Corporation). Examples of a phenol novolak type epoxy resin include EPICLON (registered trademark) N-740, N-770, and N-775 (manufactured by DIC Corporation) and jER (registered trademark) 152 and 154 (manufactured by Mitsubishi Chemical Corporation). Examples of a cresol novolak type epoxy resin include EPICLON (registered trademark) N-660, N-665, N-670, N-673, N-680, N-695, N-665-EXP, and N-672-EXP (manufactured by DIC Corporation). Examples of a glycidylamine type epoxy resin include EPICLON (registered trademark) 430 and 430-L (manufactured by DIC Corporation), TETRAD (registered trademark)-C and TETRAD (registered trademark)-X (manufactured by Mitsubishi Gas Chemical Company, Inc.), jER (registered trademark) 604 and 630 (manufactured by Mitsubishi Chemical Corporation), Sumiepoxy (registered trademark) ELM120, ELM100, ELM434, and ELM434HV (manufactured by Sumitomo Chemical. Company, Ltd.), and EPOTOTE (registered trademark) YH-434 and YH-434L (manufactured by Tohto Kasei Co., Ltd.). Examples of an alicyclic epoxy resin include DENACOL (registered trademark) EX-252 (manufactured by Nagase ChemteX Corporation), EPICLON (registered trademark) 200 and 400 (manufactured by DIC Corporation), and jER (registered trademark) 871 and 872 (manufactured by Mitsubishi. Chemical Corporation). Examples of an epoxy resin having a cyclohexeneoxide structure include EPOLEAD (registered trademark) GT-401, GT-403, GT-301, and GT-302 and CELLOXIDE (registered trademark) 2021 and 3000 (manufactured by Daicel Corporation).

Among these, in view of process-resistance such as heat-resistance, solvent-resistance, and resistance to long-time baking, and transparency, an alkoxyalkylated amino group-containing compound is preferred.

The content of the component (C) in the composition according to the present invention is generally 1% by mass to 50% by mass, based on its content in the solid contents of the composition.

A method for preparing the composition according to the present invention is not particularly limited. An example of the method is a method that includes: dissolving the copolymer as the component (A) in a solvent; and mixing the solution with the photosensitizer as the component (B) and the cross-linking agent as the component (C) in a predetermined ratio to form a uniform solution. Another example is a method that includes further adding and mixing other additives as needed in an appropriate stage of the above preparation method.

The above solvent is not particularly limited so long as it dissolves the component (A), the component (B), and the component (C). Examples of the solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, propylene glycol monobutyl ether, propylene glycol monobutyl ether acetate, toluene, xylene, methylethyl ketone, cyclopentanone, cyclohexanone, ethyl 2-hydroxy propionate, ethyl 2-hydroxy-2-methyl propionate, ethyl ethoxy acetate, ethyl hydroxy acetate, methyl 2-hydroxy-3-methyl butanoate, methyl 3-methoxy propionate, ethyl 3-methoxy propionate, ethyl 3-ethoxy propionate, methyl 3-ethoxy propionate, methyl pyruvate, ethyl acetate, butyl acetate, ethyl lactate, butyl lactate, 2-heptanone, and γ-butyrolactone.

These solvents can be used alone, or two or more thereof may be used in combination.

Among these solvents, in view of improving the leveling property of an applied film, preferred examples are propylene glycol monomethyl ether, propylene glycol monomethyl ether acetate, 2-heptanone, ethyl lactate, butyl lactate, and cyclohexanone.

The composition according to the present invention may contain a surfactant for the purpose of improving applicability. Examples of the surfactant include: nonionic surfactants such as polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants such as EFTOP (registered trademark) EF301, EF303, and EF352 (manufactured by Mitsubishi Materials Electronic Chemicals Co., Ltd. (former JEMCO, Inc.)), Megafac (registered trademark) P171, F173, and R30 (manufactured by DIC Corporation), Fluorad FC430, and PC431 (manufactured by Sumitomo 3M Ltd.), Asahi Guard (registered trademark) AG710, Surflon (registered trademark) S-382, SC-101, SC-102, SC-103, SC-104, SC-105, and SC-106 (manufactured by Asahi Glass Co., Ltd.), and Ftergent-series such as FTX-206D, FTX-212D, FTX-218, FTX-220D, FTX-230D, FTX-240D, FTX-212P, FTX-220P, FTX-228P, and FTX-240G (manufactured by NEOS Co., Ltd.); and organosiloxane polymer KP341 (manufactured by Shin-Etsu Chemical Co., Ltd.).

The above surfactants can be used alone, or two or more thereof may be used in combination.

When any of the above surfactants is used, its content in the composition according to the present invention is 3% by mass or less, preferably 1% by mass or less, and more preferably 0.5% by mass or less, based on its content in the solid contents of the composition.

The composition according to the present invention may contain additives such as curing aids, ultraviolet absorbers, sensitizers, plasticizer, antioxidants, and adhesion aids as needed, so long as they do not impair the effect of the present invention.

The use of the photosensitive resin composition for forming a mierolens according to the present invention will be described below.

Onto a substrate {such as a semiconductor substrate of, for example, silicon covered with a silicon oxide film, a semiconductor substrate of, for example, silicon covered with a silicon nitride film or a silicon oxynitride film, a silicon nitride substrate, a quartz substrate, a glass substrate (including non-alkali glass, low-alkali glass, and crystallized glass), and a glass substrate on which an ITO film is formed}, the composition according to the present invention is applied by an appropriate application method such as a spinner and a coater, and then the composition is prebaked by heating means such as a hot plate to form an applied film.

Prebaking conditions may be appropriately selected from baking temperatures of 80° C. to 250° C. and baking times of 0.3 minutes to 60 minutes. Preferred conditions are baking temperatures of 80° C. to 150° C. and baking times of 0.5 minutes to 5 minutes.

The film thickness of a film formed of the composition according to the present invention is 0.005 μm to 5.0 μm, preferably 0.01 μm to 3.0 μm.

Next, exposure through a mask (reticle) for forming a predetermined pattern is performed on the above obtained film. For exposure, the g-line and ultraviolet rays such as the i-line and a KrF excimer laser can be used. After exposure, post exposure baking is performed as needed. Conditions for the post exposure baking may be appropriately selected from heating temperatures of 80° C. to 150° C. and heating times of 0.3 minutes to 60 minutes. The film is then developed with an alkaline developer.

Examples of the alkaline developer include alkaline aqueous solutions such as: an aqueous solution of alkali metal hydroxides such as potassium hydroxide and sodium hydroxide; an aqueous solution of quaternary ammonium hydroxides such as tetramethyl ammonium hydroxide, tetraethyl ammonium hydroxide, and choline; and an aqueous solution of amines such as ethanol amine, propyl amine, and ethylenediamine. A surfactant may be further added to the developer.

Developing conditions may be appropriately selected from developing temperatures of 5° C. to 50° C. and developing times of 10 seconds to 300 seconds. The film formed of the composition according to the present invention can be developed easily at room temperature using an aqueous tetramethyl ammonium hydroxide solution. After development, rinsing is performed using, for example, ultrapure water.

Furthermore, the entire substrate is exposed using, for example, the g-line, the i-line, and the KrF excimer laser. Then, using heating means such as a hot plate, postbaking is performed. Postbaking conditions may be appropriately selected from postbaking temperatures of 100° C. to 250° C. and postbaking times of 0.5 minutes to 60 minutes.

EXAMPLES

The present invention will be described in more detail based on examples and a comparative example below. The present invention is not limited to these examples.
[Measurement of Weight Average Molecular Weight of Polymer Obtained by the Following Synthesis Examples]
Apparatus: GPC system manufactured by JASCO Corporation
Column: Shodex [registered trademark] KL-804L and 803L
Column oven: 40° C.
Flow rate: 1 ml/min
Eluate: tetrahydrofuran
[Synthesis of Polymer]

Synthesis Example 1

16.0 g of maleimide, 23.9 g of indene, 3.6 g of 2-hydroxyethyl vinyl ether, and 1.3 g of 2,2'-azobisisobutyronitrile were dissolved in 104.7 g of propylene glycol monomethyl ether, and then the solution was added dropwise to a flask in which 30.0 g of propylene glycol monomethyl ether was kept at 80° C. over 4 hours. After the completion of dropwise addition, the mixture was reacted for 18 hours. The reaction solution was cooled to room temperature and poured into diethyl ether to reprecipitate a polymer, which was dried under reduced pressure to obtain a polymer (copolymer) having a structural unit of formula (5) below.

The weight average molecular weight Mw of the obtained polymer was 9,000 (in terms of polystyrene).

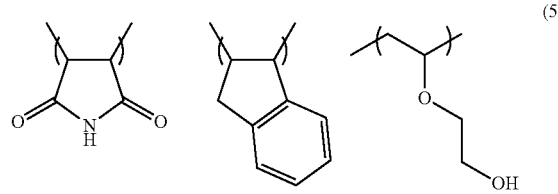

(5)

Synthesis Example 2

8.0 g of maleimide, 14.8 g of N-cyclohexylmaleimide, 18.7 g of 1,4-cyclohexane dimethanol monovinyl ether, and 1.2 g of 2,2'-azobisisobutyronitrile were dissolved in 99.7 g of propylene glycol monomethyl ether, and then the solution was added dropwise to a flask in which 28.5 g of propylene glycol monomethyl ether was kept at 80° C. over 4 hours. After the completion of dropwise addition, the mixture was reacted for 18 hours. The reaction solution was cooled to room temperature and poured into diethyl ether to reprecipitate a polymer, which was dried under reduced pressure to obtain a polymer (copolymer) having a structural unit of formula (6) below.

The weight average molecular weight Mw of the obtained polymer was 4,500 in terms of polystyrene).

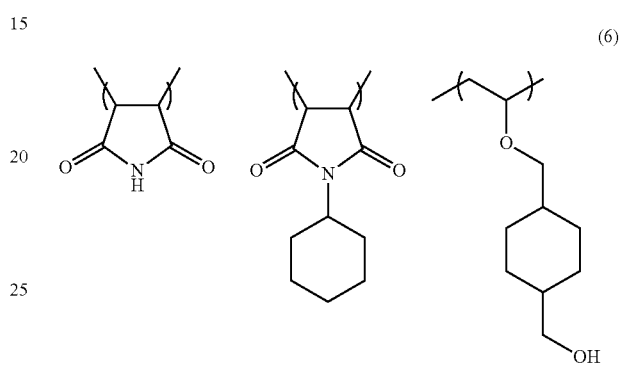

(6)

Synthesis Example 3

12.0 g of maleimide, 19.8 g of 4-tert-butyl styrene, 10.5 g of 1,4-cyclohexane dimethanol monovinyl ether, and 1.3 g of 2,2'-azobisisobutyronitrile were dissolved in 101.8 g of propylene glycol monomethyl ether, and then the solution was added dropwise to a flask in which 29.1 g of propylene glycol monomethyl ether was kept at 80° C. over 4 hours. After the completion of dropwise addition, the mixture was reacted for 18 hours. The reaction solution was cooled to room temperature and poured into acetonitrile to reprecipitate a polymer, which was dried under reduced pressure to obtain a polymer (copolymer) having a structural unit of formula (7) below.

The weight average molecular weight Mw of the obtained polymer was 28,000 (in terms of polystyrene).

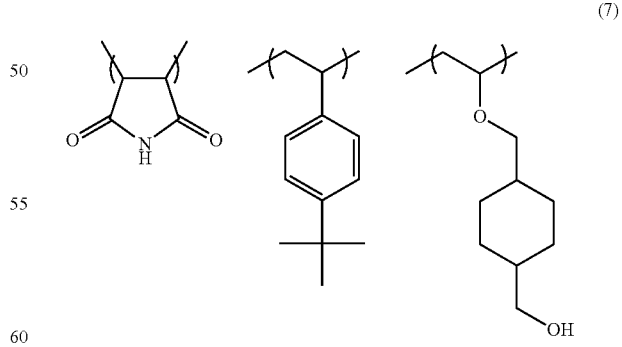

(7)

Synthesis Example 4

13.0 g of maleimide, 25.8 g of 2-vinyl naphthalene, 4.4 g of diethylene glycol monovinyl ether, and 2.1 g of 2,2'-azobisisobutyronitrile were dissolved in 106.0 g of propylene glycol monomethyl ether, and then the solution was added dropwise to a flask in which 30.3 g of propylene glycol monomethyl ether was kept at 80° C. over 4 hours. After the completion of dropwise addition, the mixture was reacted for 18 hours. The reaction solution was cooled to room temperature and poured into diethyl ether to reprecipitate a polymer, which was dried under reduced pressure to obtain a polymer (copolymer) having a structural unit of formula (8) below.

The weight average molecular weight Mw of the obtained polymer was 8,000 (in terms of polystyrene).

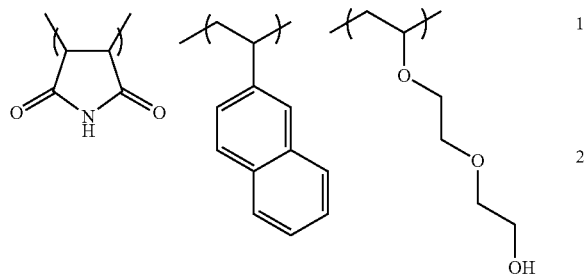

(8)

[Preparation of Photosensitive Resin Composition]

Example 1

4.0 g of the polymer as the component (A) obtained in Synthesis Example 1, 1.2 g of P-200 (manufactured by Toyo Gosei Co., Ltd.) as a photosensitizer as the component (B), 1.2 g of MX-750LM (manufactured by Sanwa Chemical Co., Ltd.) as a cross-linking agent as the component (C), and 0.02 g of Megafac (registered trademark) R-30 (manufactured by DIC Corporation) as a surfactant were dissolved in 28.0 g of propylene glycol monomethyl ether and 12.0 g of ethyl lactate to prepare a solution. The solution was then filtered using a polyethylene micro filter with a pore diameter of 0.10 μm to prepare a photosensitive resin composition for forming a microlens.

Example 2

A photosensitive resin composition for forming a microlens was prepared in accordance with the same conditions as Example 1 except that 4.0 g of the polymer obtained in Synthesis Example 2 was used as the component (A).

Example 3

A photosensitive resin composition for forming a microlens was prepared in accordance with the same conditions as Example 1 except that 4.0 g of the polymer obtained in Synthesis Example 3 was used as the component (A).

Example 4

A photosensitive resin composition for forming a microlens was prepared in accordance with the same conditions as Example 1 except that 4.0 g of the polymer obtained in Synthesis Example 4 was used as the component (A).

Comparative Example 1

4.0 g of poly(4-vinylphenol) (with a weight average molecular weight Mw of 20,000 manufactured by Sigma-Aldrich Japan K.K.) having a structural unit of formula (9) below, 1.2 g of P-200 (manufactured by Toyo Gosei Co., Ltd.) as a photosensitizer, and 1.2 g of MX-750LM (manufactured by Sanwa Chemical Co., Ltd.) as a cross-linking agent, and 0.02 g of Megafac (registered trademark) R-30 (manufactured by DIC Corporation) as a surfactant were dissolved in 33.0 g of propylene glycol monomethyl ether and 14.0 g of ethyl lactate to prepare a solution. The solution was then filtered using a polyethylene micro filter with a pore diameter of 0.10 μm to prepare a photosensitive resin composition for forming a microlens.

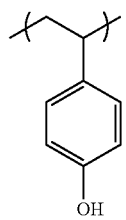

(9)

[Transmittance Measurement]

The photosensitive resin compositions prepared in Examples 1 to 4 and Comparative Example 1 were each applied onto a quartz substrate using a spin coater and prebaked on a hot plate at 100° C. for 3 minutes. Ultraviolet rays with a dose of 500 mJ/cm$^2$ at 365 nm were then applied to the entire composition by an ultraviolet irradiation apparatus PLA-501(F) (manufactured by Canon Inc.) (photobleaching). Each composition was then postbaked on the hot plate at 200° C. for 5 minutes to form a film with a film thickness of 600 nm. The transmittance at a wavelength of 400 rim of the film was measured using a UV-VIS spectrophotometer UV-2550 (manufactured by Shimadzu Corporation). The film was further heated at 260° C. for 5 minutes, then the transmittance at a wavelength of 400 nm thereof was measured The evaluation results are shown in Table 1.

TABLE 1

| | Transmittance/% (400 nm) | |
| --- | --- | --- |
| | 200° C. | 260° C. |
| Example 1 | 98 | 96 |
| Example 2 | 99 | 96 |
| Example 3 | 98 | 95 |
| Example 4 | 98 | 96 |
| Comparative Example 1 | 95 | ≤78 |

From the results of Table 1, the films formed of the photosensitive resin compositions for forming a microlens according to the present invention showed high heat-resistance and underwent little coloration even after being heated at 260° C. The film formed of the photosensitive resin composition prepared in Comparative Example I showed a film transmittance of 95% after postbaking at 200° C. for 5 minutes, but further heating at 260° C. for 5 minutes reduced its film transmittance to 78% or less. The film transmittance is in general required to be 90% or more, and it is preferable that the transmittance hardly change even after being heated. Comparative Example 1 gave a result that does not satisfy this requirement.

[Patterning Test]

The photosensitive resin compositions prepared in Example 1 to Example 4 were each applied onto a silicon wafer using a spin coater and prebaked on a hot plate at 100°

C. for 90 seconds to form a photosensitive resin film with a film thickness of 600 nm. The film was then exposed through a gray-scale mask using an i-line stepper NSR-2205i 12D (NA=0.63) (manufactured by Nikon Corporation). The film was then subjected to post-exposure baking (PEB) on the hot plate at 100° C. for 90 seconds, developed with an aqueous tetramethyl ammonium hydroxide (TMAH) solution (0.2% by mass for the photosensitive resin composition prepared in Example 1 and 1.0% by mass for the photosensitive resin compositions prepared in Example 2 to Example 4) for 60 seconds, rinsed with ultrapure water for 20 seconds, and dried to form a lens pattern with a diameter of 2.0 μm. Furthermore, using the i-line stepper, the i-line with a dose of 500 mJ/cm$^2$ was applied to the entire film (photobleaching), and postbaking was performed on the hot plate (first, baked at 140° C. to 160° C. for 5 minutes, and then backed at 200° C. for 5 minutes). The film was further heated at 260° C. for 5 minutes. Using a scanning electron microscope S-4800 (manufactured by Hitachi High-Technologies Corporation), a pattern after development, rinsing, and drying, a pattern after the above postbaking, and a pattern after the 260° C.-heating were observed. It was confirmed that for all cases using the photosensitive resin compositions prepared in Example 1 to Example 4 both the pattern shape after the postbaking and the pattern shape after the 260° C.-heating were a shape that maintains the lens pattern shape after development, rinsing, and drying.

[Test on Elution to Photoresist Solvent]

The photosensitive resin compositions prepared in Example 1 to Example 4 were each applied onto a silicon wafer using a spin coater and prebaked on a hot plate at 100° C. for 3 minutes. Ultraviolet rays with a dose of 500 mJ/cm$^2$ at 365 nm were then applied to the entire composition by an ultraviolet irradiation apparatus PLA-501(F) (manufactured by Canon Inc.) (photobleaching). Each composition was then postbaked on the hot plate at 200° C. for 5 minutes to form a film with a film thickness of 600 nm. The films were each immersed into acetone, N-methylpyrrolidone, 2-propanol, and 2-heptanone at 23° C. for 10 minutes. It was confirmed that all films formed of the photosensitive resin compositions prepared in Example 1 to Example 4 gave a change in film thickness before and after immersion into the above solvents of 5% or less.

The invention claimed is:

1. A photosensitive resin composition for forming a microlens, the photosensitive resin composition comprising:
   a component (A);
   a component (B);
   a component (C); and
   a solvent, wherein
   the component (A) is a copolymer having a maleimide structural unit of formula (1) below, a vinyl ether structural unit of formula (2) below, and at least one of the three structural units of formula (3), formula (4), and formula (5) below,
   the component (B) is a photosensitizer, and
   the component (C) is a cross-linking agent

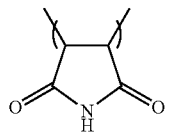
(1)

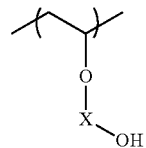
(2)

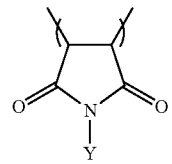
(3)

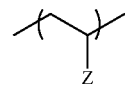
(4)

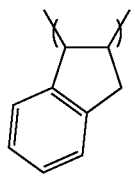
(5)

(where X is a $C_{1-20}$ hydrocarbon group; Y is a $C_{1-5}$ alkyl group, a $C_{5-6}$ cycloalkyl group, a phenyl group, or a benzyl group; and Z is a phenyl group, a naphthyl group, an anthracenyl group, a biphenylyl group, or a $C_{1-8}$ alkoxy group, provided that the group represented by X optionally has an ether bond or a cyclic structure; part of or all of hydrogen atoms of the group represented by Y are optionally substituted with a halogen atom, a carboxy group, a hydroxy group, an amino group, or a nitro group; and part of or all of hydrogen atoms of a phenyl group, a naphthyl group, an anthracenyl group, or a biphenylyl group represented by Z are optionally substituted with a $C_{1-10}$ alkyl group, a $C_{5-6}$ cycloalkyl group, a halogen atom, a carboxy group, a hydroxy group, an amino group, or a nitro group).

2. The photosensitive resin composition for forming a microlens according to claim 1, wherein the vinyl ether structural unit of formula (2) is represented by formula (2-1) or formula (2-2):

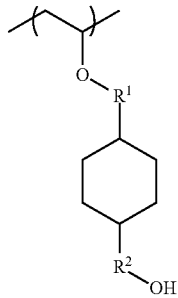
(2-1)

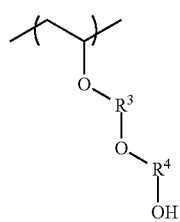

(2-2)

(where $R^1$ and $R^2$ are each independently a linear or branched $C_{1-7}$ alkylene group or a single bond; and $R^3$ and $R^4$ are each independently a linear or branched $C_{1-10}$ alkylene group).

3. The photosensitive resin composition for forming a microlens according to claim 1, wherein the weight average molecular weight of the copolymer is 1000 to 50000.

4. A cured film obtained from the photosensitive resin composition for forming a microlens as claimed in claim 1.

5. A microlens formed from the photosensitive resin composition for forming a microlens as claimed in claim 1.

* * * * *